(12) United States Patent
Suh et al.

(10) Patent No.: US 7,230,374 B2
(45) Date of Patent: Jun. 12, 2007

(54) FULL COLOR ORGANIC LIGHT-EMITTING DEVICE HAVING COLOR MODULATION LAYER

(75) Inventors: Min-Chul Suh, Seongnam-si (KR); Ho-Kyoon Chung, Yongin-si (KR); Seong-Taek Lee, Suwon-si (KR); Jang-Hyuk Kwon, Suwon-si (KR)

(73) Assignee: Samsung SDI Co., Ltd., Suwon (KR)

( * ) Notice: Subject to any disclaimer, the term of this patent is extended or adjusted under 35 U.S.C. 154(b) by 0 days.

(21) Appl. No.: 10/981,565

(22) Filed: Nov. 5, 2004

(65) Prior Publication Data

US 2005/0093434 A1 May 5, 2005

Related U.S. Application Data

(63) Continuation-in-part of application No. 10/914,119, filed on Aug. 10, 2004.

(30) Foreign Application Priority Data

Sep. 22, 2003 (KR) ............................... 2003-65683

(51) Int. Cl.
*H05B 33/22* (2006.01)
(52) U.S. Cl. ...................... 313/504; 313/501
(58) Field of Classification Search ........ 313/498–512; 345/43, 45, 76, 92, 36; 427/68, 555; 428/690, 428/917, 913; 315/169.3
See application file for complete search history.

(56) References Cited

U.S. PATENT DOCUMENTS

| | | | |
|---|---|---|---|
| 5,858,624 A * | 1/1999 | Chou et al. ................. | 430/321 |
| 5,998,085 A * | 12/1999 | Isberg et al. ................ | 430/200 |
| 6,515,428 B1 | 2/2003 | Yeh et al. | |
| 6,522,066 B2 | 2/2003 | Sheu et al. | |
| 6,563,263 B1 * | 5/2003 | Kawaguchi et al. ......... | 313/509 |
| 2001/0026257 A1 * | 10/2001 | Kimura ....................... | 345/87 |
| 2001/0043043 A1 * | 11/2001 | Aoyama et al. ............. | 313/506 |
| 2002/0014628 A1 * | 2/2002 | Koyama ...................... | 257/72 |
| 2003/0020073 A1 * | 1/2003 | Long et al. ................... | 257/79 |
| 2003/0224205 A1 * | 12/2003 | Li et al. ...................... | 428/690 |
| 2003/0230972 A1 * | 12/2003 | Cok ............................ | 313/504 |

(Continued)

FOREIGN PATENT DOCUMENTS

JP 11-135257 5/1999

(Continued)

*Primary Examiner*—Mariceli Santiago
*Assistant Examiner*—Christopher M. Raabe
(74) *Attorney, Agent, or Firm*—H.C. Park & Associates, PLC

(57) ABSTRACT

An organic light-emitting device has a color modulation layer. The organic light-emitting device comprises a substrate, a first electrode positioned on the substrate and a second electrode positioned on the first electrode, wherein at least one of the first electrode and the second electrode is transparent. An organic functional layer having at least an emission layer emitting white color light is interposed between the first electrode and the second electrode. A color modulation layer formed by a laser-induced thermal imaging method is positioned on a surface opposite to a surface adjacent to the emission layer of the transparent electrode, wherein the color modulation layer has at least a color conversion medium.

31 Claims, 9 Drawing Sheets

U.S. PATENT DOCUMENTS

| | | | |
|---|---|---|---|
| 2004/0058193 A1* | 3/2004 | Hatwar | 428/690 |
| 2004/0233139 A1* | 11/2004 | Asano et al. | 345/76 |
| 2005/0008892 A1* | 1/2005 | Yamamoto et al. | 428/690 |

FOREIGN PATENT DOCUMENTS

| | | |
|---|---|---|
| JP | 2002-075636 | 3/2002 |
| JP | 2003-187974 A1 | 7/2003 |
| JP | 2003-243154 | 8/2003 |
| JP | 2003-257666 | 9/2003 |
| KR | 2001-0000943 | 8/2001 |
| WO | 97-47050 | 12/1997 |
| WO | 03-069957 | 8/2003 |

* cited by examiner

FULL COLOR ORGANIC LIGHT-EMITTING DEVICE HAVING COLOR MODULATION LAYER

CROSS-REFERENCE TO RELATED APPLICATIONS

This application claims the benefit of Korea Patent Application No. 2003-65683, filed on Sep. 22, 2003, the disclosure of which is hereby incorporated by reference in its entirety and is a continuation-in-part of U.S. patent application Ser. No. 10/914,119, filed on Aug. 10, 2004, the disclosure of which is hereby incorporated by reference in its entirety.

FIELD OF THE INVENTION

The present invention relates to an organic light-emitting device (OLED) and, more particularly, to an organic light-emitting device having color modulation layer.

BACKGROUND OF THE INVENTION

In general, an organic light-emitting device (hereinafter, referred to as OLED) comprises a substrate, an anode positioned on the substrate, an emission layer positioned on the anode, and a cathode positioned on the emission layer. In the OLED having the above structure, when a voltage is applied between the anode and the cathode, holes and electrons are injected into the emission layer, and then combined in the emission layer to create exitons, which decay radiatively. This radiation is called electroluminescence (EL)

A fabrication method of a conventional full-color OLED includes forming emission layers corresponding to red (R), green (G) and blue (B), respectively. But in this method, the emission layers have different lifetime characteristics one from another, so that it is difficult to maintain white balance when they are driven for a long time.

To solve this problem, U.S. Pat. No. 6,515,428 discloses an OLED with a color filter (hereinafter, referred to as CF) formed by a photolithography process and an emission layer for emitting white color light. However, forming the CFs of R, G and B color by the photolithography process requires repeating the process of spin coating the CF material of each color, as well as exposing, developing, and patterning. In these processes, a CF previously formed may be contaminated by a CF material of another color which is spin coated on the CF. Furthermore, a thermal process should be performed to remove any volatile solvent, etc., contained in the CF formed by the photolithography process. Thus, forming the CF by the photolithography process has a disadvantage of requiring many processes and more time to fabricate the OLED.

U.S. Pat. No. 6,522,066 discloses an OLED with a color conversion medium (hereinafter, referred to as CCM) formed by the photolithography process and an emission layer for emitting blue color light. The problems associated with forming the CCM by the photolithography process are often the same as those associated with forming the CF.

To solve the above problems, Korean patent application number 2001-0000943 discloses an OLED including CFs or CCMs formed by a vacuum deposition process. However, forming the CFs or the CCMs using the vacuum deposition process is performed by respectively depositing layers corresponding to the R, G and B using metal masks. This makes it hard to implement a high resolution due to difficulties aligning between the metal mask with the substrate. A further disadvantage is that the layers corresponding to the R, G and B are deposited in a separate chamber, respectively, significantly increasing an equipment investment.

SUMMARY OF THE INVENTION

An exemplary embodiment of the present invention provides an OLED having a reduced fabrication time and a high resolution, as well as maintaining white balance even after it is driven for a long time. In an embodiment of the present invention, the OLED comprises a substrate, a first electrode positioned on the substrate and a second electrode positioned on the first electrode, wherein at least one of the first electrode and the second electrode is a transparent electrode. An organic functional layer includes at least an emission layer emitting white color light is interposed between the first and the second electrodes. A color modulation layer formed by a laser-induced thermal imaging (hereinafter, referred to as LITI) method is positioned on a surface opposite to a surface adjacent to the emission layer of the transparent electrode, wherein the color modulation layer has at least a CCM.

BRIEF DESCRIPTION OF THE DRAWINGS

The above and other features and advantages of the present invention will become more apparent to those of ordinary skill in the art by describing in detail exemplary embodiments thereof with reference to the attached drawings.

DETAILED DESCRIPTION OF THE INVENTION

Figure 1:
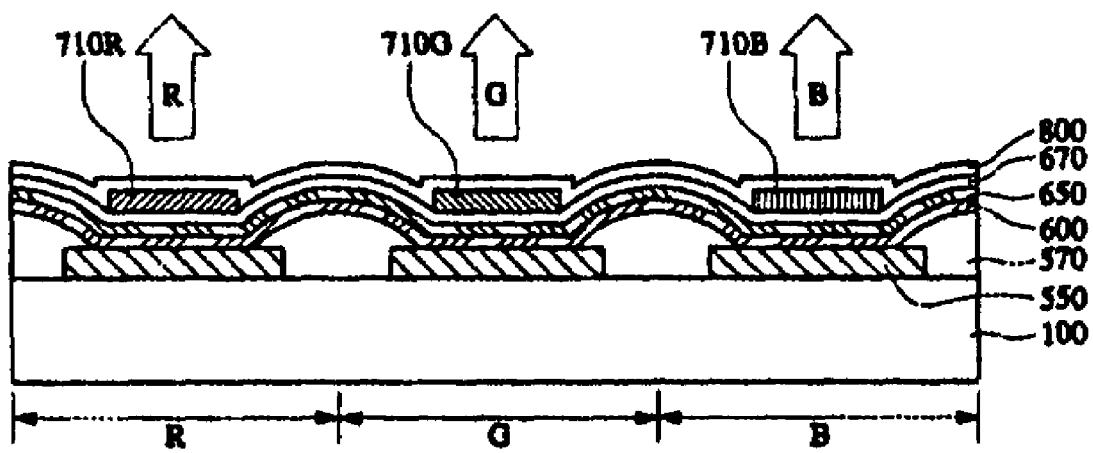
FIG. 1 and FIG. 2 are cross-sectional views illustrating an OLED and a method for fabricating the same in accordance with an exemplary embodiment of the present invention.

The present invention will now be described more fully hereinafter with reference to the accompanying drawings, in which exemplary embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Thus, the various embodiments described in FIGS. 1, 2, 3, 4, 5, 6, 7, 8, 9, 10, 11 and 12 may be modified without departing from the scope of the invention. In the drawings, like numbers refer to like elements throughout the specification.

The OLED in each exemplary embodiment of the present invention comprises a substrate, a first electrode positioned on the substrate and a second electrode positioned on the first electrode. An organic functional layer is interposed between the first electrode and the second electrode and has at least an emission layer.

At least one of the first electrode and the second electrode is a transparent electrode. In detail, when the first electrode is the transparent electrode, the second electrode may be a transparent or reflective electrode, and when the first electrode is the reflective electrode, the second electrode is transparent. The transparent electrode transmits the light emitted from the emission layer. The OLED can be classified into a top-emitting type, a bottom-emitting type and a double-side-emitting type depending on the position of the transparent electrode.

The transparent electrode may be an anode or a cathode. When the transparent electrode is the cathode, the transparent electrode may be formed of a very thin layer enough to transmit the light by using, for example, Mg, Ca, Al, Ag, Ba, an alloy thereof or other similar material. When the transparent electrode is the anode, the transparent electrode may be formed of, for example, ITO (Indium Tin Oxide), IZO (Indium Zinc Oxide) or other similar material, which is a transparent conductive material. The reflective electrode may also be an anode or a cathode. When the reflective electrode is the anode, the reflective electrode may be a stacked structure having a reflective plate and a transparent layer formed of, ITO, IZO or other similar material, or a structure having a single layer consisting of one or more selected materials from a group consisting of, for example, Ni, Pt, Au, Ir, Cr, oxides thereof or other similar material. The reflective plate may be, for example, formed of AlNd or other similar material. When the reflective electrode is the cathode, the reflective electrode may be formed with a thickness enough to reflect light by using, for example, Mg, Ca, Al, Ag, Ba, an alloy thereof or other similar material.

The transparent electrode has one surface adjacent to the emission layer and another surface opposite thereof. A color modulation layer formed by a LITI method is positioned on the opposite surface. The color modulation layer modulates a color of light emitted from the emission layer to give light of a predetermined color. In this case, an emission layer of single color is formed on R, G and B pixel regions. The color modulation layers for R, G and B colors are separately formed on the R, G and B pixel regions to implement a full color OLED. Therefore, emission layers for R, G and B colors that have different lifetime characteristics from one another are not formed, so that white balance can be maintained even after it is driven for a long time. The color modulation layer is at least one of a CF and a CCM. In one embodiment, the color modulation layer may be the CF or the CCM. Alternatively, the color modulation layer may have the CF and the CCM in a stacked structure.

The CF may include a pigment and a polymer binder, and can be classified into a red CF, a green CF and a blue CF based on the type of the pigment. The red, the green and the blue CFs filter light emitted from the emission layer in wavelength ranges of red, green and blue colors, respectively. In this case, the color of light emitted from the emission layer may be white.

The CCM may include a fluorescent material and a polymer binder. The fluorescent material is excited by the light incident from the emission layer and makes a transition to a ground state to emit light with a wavelength longer than the incident light. The CCM is classified into a red CCM, a green CCM, and a blue CCM based on the type of the fluorescent material. The red, the green and the blue CCMs convert the incident light to a red, a green, and a blue color, respectively. In this case, the color of the incident light may be white or blue.

In the stacked structure, the CCM may be positioned on a surface opposite to a surface adjacent to the emission layer of the transparent electrode, and the CF may be positioned on a surface opposite to a surface adjacent to the transparent electrode of the CCM. In this case, the red, the green and the blue CCMs convert the incident light to a red, a green, and a blue color, respectively. Thereafter, the red, the green and the blue CFs filter the red, the green and the blue colors, respectively, thereby forming clearer red, green and blue colors. In this case, the color of the incident light may be white or blue.

Forming the color modulation layer by a LITI method is performed by a method described below in detail. A light-to-heat conversion layer is formed on a base film, and a transfer layer for the color modulation layer is formed on the light-to-heat conversion layer, thereby forming a donor film. The donor film is positioned over a substrate to make the transfer layer face the substrate. A laser is irradiated on the base film of the donor film, so that the transfer layer is transferred onto the substrate, thereby forming the color modulation layer on the substrate. By repeating this method, color modulation layers for R, G and B are formed on the substrate, respectively. In accordance with the above-mentioned method, the time for fabricating the color modulation layers can be reduced compared to the photolithography process. A higher resolution can also be implemented, compared to using the vacuum deposition process.

The emission layer emitting a single color of light can be formed to have two or more sub-emission layers. In this case, the sub-emission layers emit lights having different wavelengths from one another so that the emission layer can emit a single color of light. In addition, the emission layer can be formed of a polymer material and/or a non-polymer material, and can be formed by a spin-coating or a vacuum deposition method. Other processes may also be used.

Figure 2:
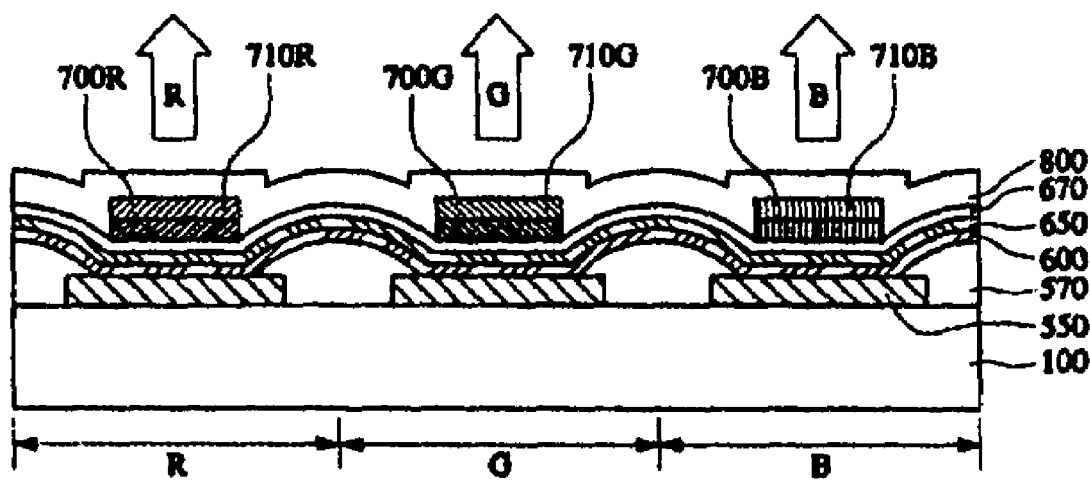

FIG. 1 and FIG. 2 are cross-sectional views illustrating a top-emitting passive matrix OLED having color modulation layers and a method for fabricating the same in accordance with an exemplary embodiment of the present invention.

Referring to FIG. 1 and FIG. 2, a substrate 100 has a red pixel region R, a green pixel region G and a blue pixel region B. A reflective layer (not shown) may be formed over an entire surface of the substrate 100. The reflective layer prevents light from leaking through the substrate 100. First electrodes 550 are formed to be separated from one another on the reflective layer or the substrate 100. Each of the first electrodes 550 corresponds to each of the pixel regions R, G and B. In the present embodiment, the first electrodes 550 are formed of reflective material that can reflect the light. In addition, the first electrodes 550 may be formed as anodes or cathodes.

A pixel-defining layer 570 is formed on the substrate where the first electrodes 550 are formed. The pixel-defining layer 570 has openings to expose some portions of the surfaces of the first electrodes 550. The pixel-defining layer 570 is, for example, formed of an acrylic-based organic layer. An organic functional layer 600 is then formed to have at least an emission layer on the exposed first electrodes 550 of the pixel regions R, G and B. The organic functional layer 600 may be formed to further include a charge transporting layer and/or a charge injection layer.

A second electrode 650 is formed across the first electrodes 550 on the organic functional layer 600. In the present embodiment, the second electrode 650 is a transparent electrode, and light emitted from the emission layer is transmitted through the second electrode 650. The second electrode 650 is a cathode when the first electrodes 550 are anodes, and an anode when the first electrodes 550 are cathodes. A passivation layer 670 is formed on the second electrode 650. According to an embodiment of the invention, the passivation layer 670 may be transparent. The passivation layer 670 may be formed of one of an inorganic layer, an organic layer and a composite layer thereof. The inorganic layer is one selected from a group consisting of, for example, ITO, IZO, $SiO_2$, SiNx, $Y_2O_3$, $Al_2O_3$ and similar material. The organic layer may be parylene, HDPE or similar material, and the composite layer may be formed of $Al_2O_3$ and an organic polymer or similar material.

Thereafter, color modulation layers for R, G and B are formed by a LITI method on the passivation layer 670 to correspond to the first electrodes 550. The color modulation layer is at least one of a CF and a CCM.

The color modulation layers may be a red CF 710R, a green CF 710G and a blue CF 710B as shown in FIG. 1. In this case, the emission layer may be formed of a layer that emits white color light.

According to another exemplary embodiment of the invention, the color modulation layers may be a red CCM 700R, a green CCM 700G and a blue CCM 700B, as shown in FIG. 2. In this case, the emission layer may be formed of a layer that emits blue color light or white color light. When the emission layer emits the blue color light, the blue CCM 700B may not be formed. Although FIG. 2 illustrates a CCM stacked with a CF, it is understood that a CCM may be used alone.

Further, the color modulation layer may have a stacked structure of CFs and the CCMs by forming a red CF 710R, a green CF 710G and a blue CF 710B on the CCMs 700R, 700G and 700B, respectively, as shown in FIG. 2. In this case, the color modulation layer having the CF and the CCM is formed at one time by the LITI method. Alternatively, the red CCM 700R, green CCM 700G and blue CCM 700B may be formed on the CFs 710R, 710G and 710B respectively. In this case, the emission layer may be formed of a layer that emits blue color light or white color light.

An overcoating layer 800 may be then formed on the CFs (710R, 710G and 710B of FIG. 1 and FIG. 2) and/or on the CCMs (700R, 700G and 700B of FIG. 2) when CFs are not formed on the CCMs. The overcoating layer 800 may be a transparent layer, and may act to prevent the CFs 710R, 710G and 710B or the CCMs 700R, 700G and 700B from physical damage, etc. This results in fabricating a top-emitting passive matrix OLED having a color modulation layer.

Figure 3:
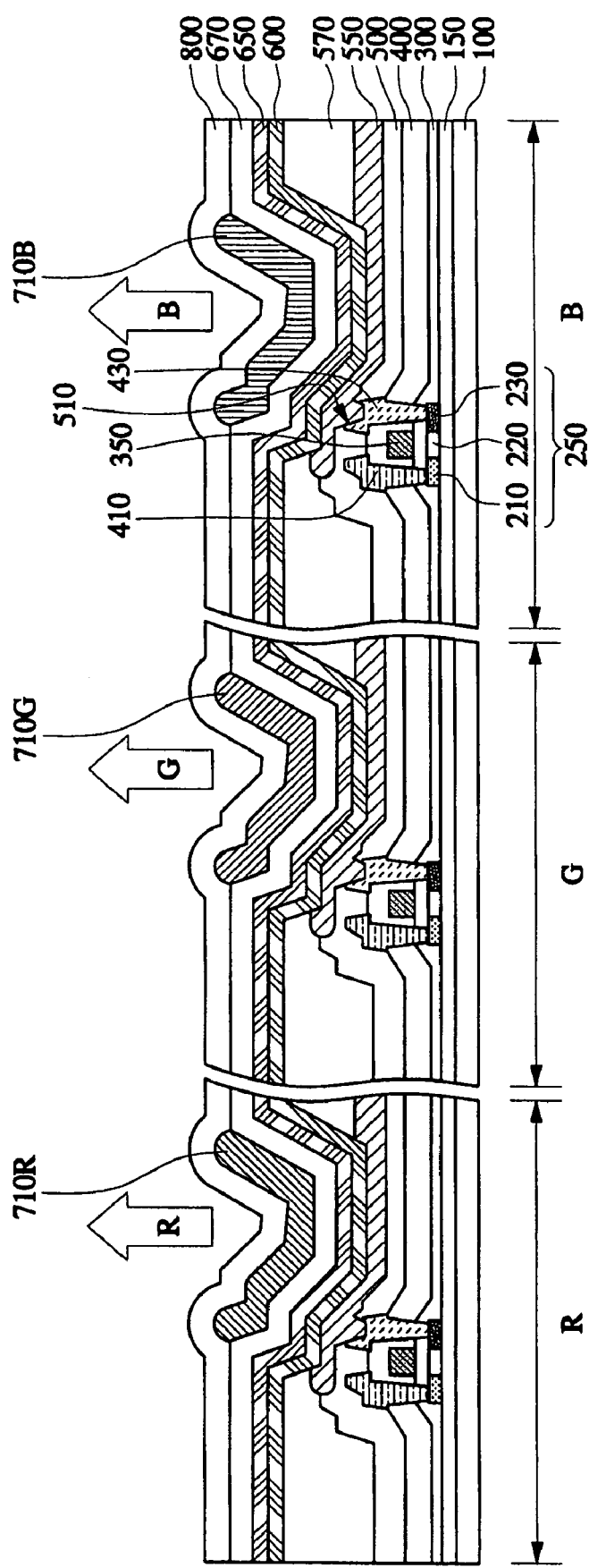
FIG. 3 and FIG. 4 are cross-sectional views illustrating an OLED and a method for fabricating the same in accordance with another exemplary embodiment of the present invention.
Figure 4:
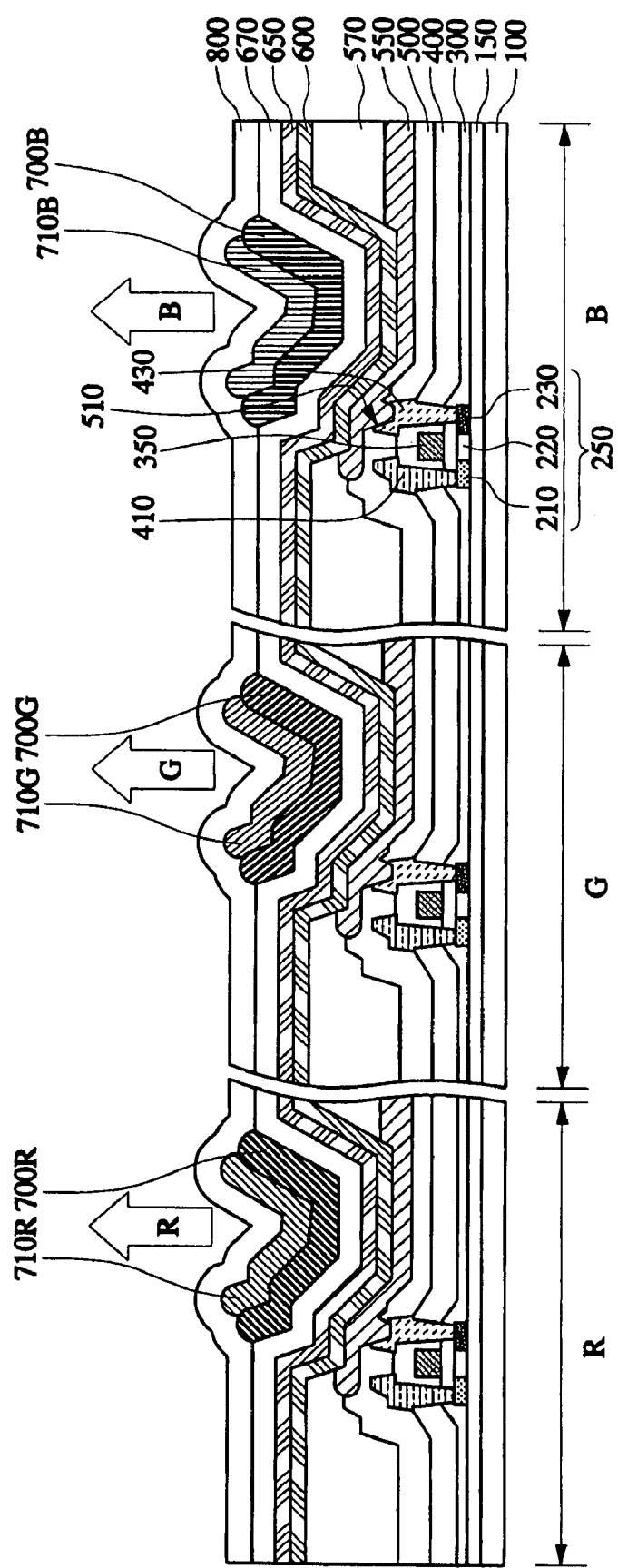

FIG. 3 and FIG. 4 are cross-sectional views illustrating a top-emitting active matrix OLED having color modulation layers and a method for fabricating the same in accordance with another exemplary embodiment of the present invention.

Referring to FIG. 3 and FIG. 4, a substrate 100 has a red pixel region R, a green pixel region G and a blue pixel region B. A reflective layer (not shown) may be formed over an entire surface of the substrate 100, and a buffer layer 150 may be formed on the reflective layer. The buffer layer 150 protects a thin film transistor (hereinafter, referred to as TFT), formed in a subsequent process, from impurities that may smear into the TFT from the substrate 100. Active layer 250 has a source region 210, a drain region 230 and a channel region 220 for each of the pixel regions R, G and B. A first insulation layer 300 is formed on the active layers 250, and gates 350 are formed on the first insulation layer 300 to correspond to the channel regions 220, respectively. A second insulation layer 400 covering the gates 350 is formed, and source electrodes 410 and drain electrodes 430 are formed on the second insulation layer 400 to electrically connect to the source regions 210 and the drain regions 230, respectively. The active layer 250, source electrode 410, drain electrode 430 and gate 350 form a TFT. A third insulation layer 500 covering the TFTs is formed, and via holes 510 are formed to expose each of the drain electrodes 430 in the third insulation layer 500.

The first electrodes 550 are formed to be separated from one another on the substrate where the via holes 510 are formed for each of the pixel regions R, G and B. As a result, the first electrode 550 is electrically connected to the drain electrode 430, namely, to the TFT, through the via hole 510. In the present embodiment, the first electrode 550 is a reflective electrode that reflects the light. The first reflective electrodes 550 may be formed as anodes or cathodes.

The pixel-defining layer 570 is formed to have openings that expose some portions of surfaces of the first electrodes 550. The pixel-defining layer 570 is, for example, formed of an acrylic-based organic layer. An organic functional layer 600 is then formed to have at least an emission layer on the exposed first electrodes 550 of the pixel regions R, G and B. The organic functional layer 600 may be formed to further include a charge transporting layer and/or a charge injection layer.

The second electrodes 650 are formed on the organic functional layer 600. In the present embodiment, the second electrode 650 is a transparent electrode, and the light emitted from the emission layer is transmitted through the second electrode 650. The second electrode 650 is a cathode when the first electrode 550 is an anode, and an anode when the first electrode 550 is a cathode. The passivation layer 670 is formed on the second electrode 650, and the passivation layer 670 may be transparent. The passivation layer 670 may be formed of one of an inorganic layer, an organic layer and a composite layer thereof. According to an exemplary embodiment of the invention, the inorganic layer may be one selected from a group consisting of ITO, IZO, $SiO_2$, SiNx, $Y_2O_3$, $Al_2O_3$, and similar materials, the organic layer is parylene, HDPE or similar material, and the composite layer is formed of $Al_2O_3$ and an organic polymer, or similar material.

Color modulation layers are formed using a LITI method on the passivation layer 670 to correspond to the first electrodes 550. The color modulation layer is at least one of a CF and a CCM. According to an exemplary embodiment of the present invention, the color modulation layers may be a red CF 710R, a green CF 710G and a blue CF 710B, as shown in FIG. 3. In this case, the emission layer may be formed of a layer that emits white color light.

According to another exemplary embodiment of the invention, the color modulation layers may be a red CCM 700R, a green CCM 700G and a blue CCM 700B, as shown in FIG. 4. In this case, the emission layer may be formed of a layer that emits blue color light or white color light. When the emission layer emits the blue color light, the blue CCM 700B may not be formed. Like the previous embodiment, although FIG. 4 illustrates a CCM stacked with a CF, it is understood that a CCM may be used alone.

The color modulation layer further may have a stacked structure of a CF and the CCM by forming a red CF 710R, a green CF 710G and a blue CF 710B on the CCMs 700R, 700G and 700B, respectively as shown in FIG. 4. In this case, the color modulation layer having the CF and the CCM may be formed at one time by the LITI method. Alternatively, the red CCM 700R, green CCM 700G and blue CCM 700B may be formed on the CFs 710R, 710G and 710B respectively. In this case, the emission layer may be formed of a layer that emits blue color light or white color light.

The overcoating layer 800 is then formed on the CFs (710R, 710G and 710B of FIG. 3 and FIG. 4) or on the CCMs (700R, 700G and 700B of FIG. 4) when the CFs 710R, 710G and 710B are not formed on the CCMs 700R, 700G and 700B. The overcoating layer 800 is a transparent one, and prevents the CFs 710R, 710G and 710B or the CCMs 700R, 700G and 700B from physical damages, etc. As a result, the top-emitting active matrix OLED having the color modulation layer is fabricated.

Figure 5:
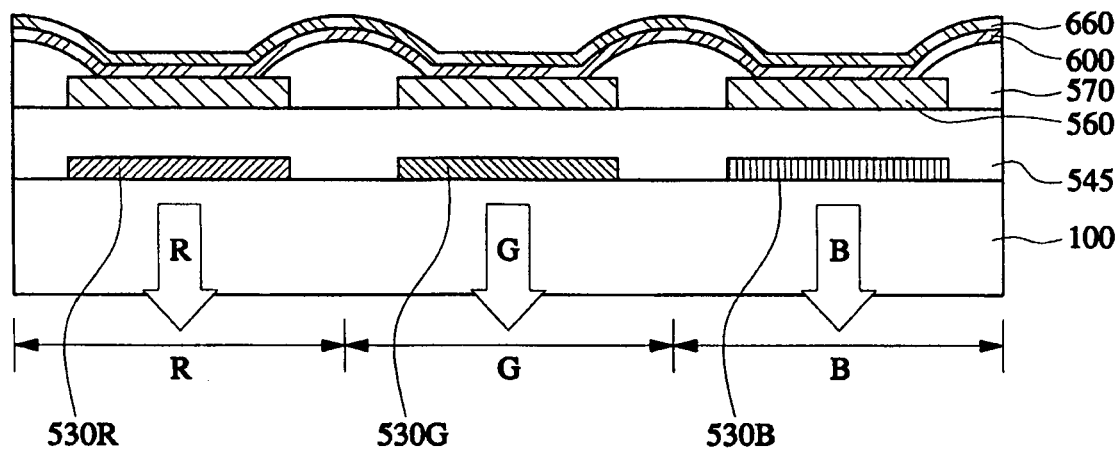
FIG. 5 and FIG. 6 are cross-sectional views illustrating an OLED and a method for fabricating the same in accordance with another exemplary embodiment of the present invention.
Figure 6:
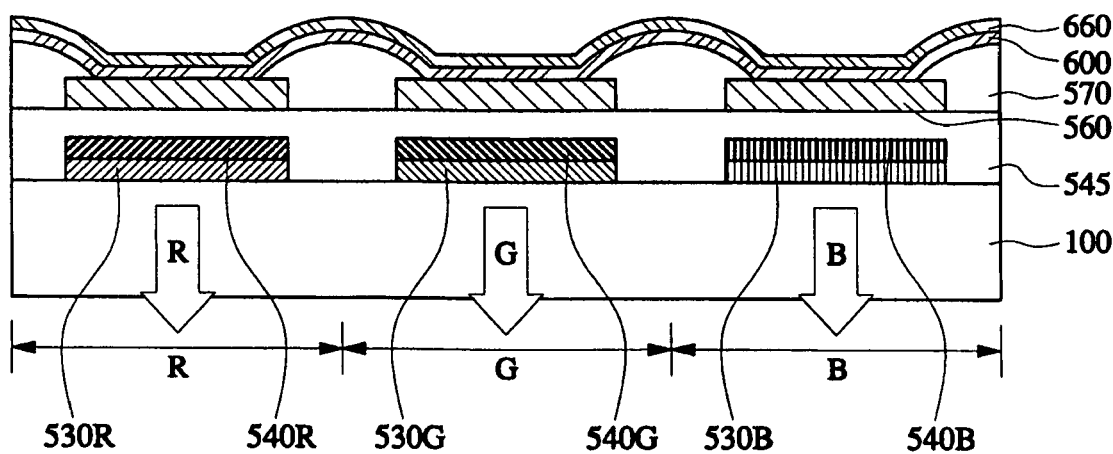

FIG. 5 and FIG. 6 are cross-sectional views illustrating a bottom-emitting passive matrix OLED having color modulation layers and a method for fabricating the same in accordance with another exemplary embodiment of the present invention.

Referring to FIG. 5 and FIG. 6, the substrate 100 having a red pixel region R, a green pixel region G and a blue pixel region B is provided. In the present embodiment, the substrate 100 is transparent and can transmit light.

Color modulation layers are formed using a LITI method on the substrate 100 to be separated from one another, each for the pixel regions R, G and B. The color modulation layer is at least one of a CF and a CCM.

The color modulation layers may be a red CF 530R, a green CF 530G and a blue CF 530B, as shown in FIG. 5. In this case, an emission layer to be formed in a subsequent process is formed to emit white color light.

The color modulation layers also may be a red CCM 540R, a green CCM 540G and a blue CCM 540B, as shown in FIG. 6. In this case, the emission layer to be formed in a subsequent process may be formed of one that emits blue color light or white color light, and the blue CCM 540B may not be formed when the emission layer emits the blue color light. Although FIG. 6 shows a CCM stacked with a CF, it is understood that a CCM alone may be used alone.

Further, the color modulation layer may have a stacked structure of a CF and the CCM by forming a red CF 530R, a green CF 530G and a blue CF 530B before forming the CCMs 540R, 540G and 540B as shown in FIG. 6. In this case, the color modulation layer having the CF and the CCM is formed at one time by the LITI method. Alternatively, the red CCM 540R, green CCM 540G and blue CCM 540B may be formed on the CFs 530R, 530G and 530B respectively. In this case, the emission layer to be formed in a subsequent process may be formed of a layer that emits blue color light or white color light.

An overcoating layer 545 is formed on the CFs (530R, 530G and 530B of FIG. 5) and/or the CCMs (540R, 540G and 540B of FIG. 6). The overcoating layer 545 is a transparent one, and prevents the CFs 530R, 530G and 530B or the CCMs 540R, 540G and 540B from physical damages, etc, and also covers steps that may occur due to the formation of the CCMs 540R, 540G and 540B or the CFs 530R, 530G and 530B.

The first electrodes 560 are formed on the overcoating layer 545 to correspond to the CFs 530R, 530G and 530B, respectively. In the present embodiment, the first electrodes 560 are transparent, and the light emitted from the emission layer to be formed in a subsequent process is transmitted through the first electrodes 560. The first electrodes 560 may be formed as anodes or cathodes. The pixel-defining layer 570 is formed to have openings, which expose some portions of surfaces of the first electrodes 560 on the substrate 100 where the first electrodes 560 are formed. The pixel-defining layer 570 is, for example, formed of an acrylic-based organic layer or similar material. An organic functional layer 600 is then formed to have at least an emission layer on the exposed first electrodes 560 of the pixel regions R, G and B. The organic functional layer 600 may be formed to further include a charge transporting layer and/or a charge injection layer.

The second electrodes 660 are formed across the first electrodes 560 on the organic functional layer 600. In the present embodiment, the second electrode 660 is reflective and reflects the light emitted from the emission layer. The second electrode 660 is formed as a cathode when the first electrodes 560 are anodes, and an anode when the first electrodes 560 are cathodes. As a result, the bottom-emitting passive matrix OLED having the color modulation layers is fabricated.

Figure 7:
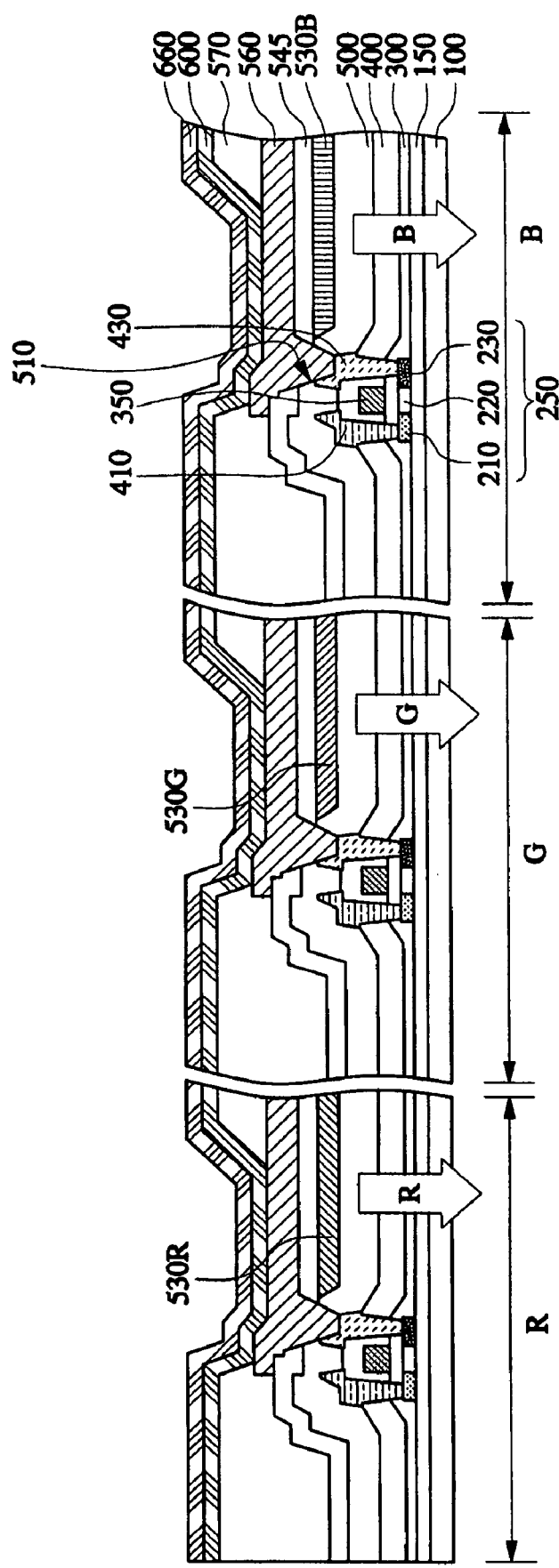
FIG. 7 and FIG. 8 are cross-sectional views illustrating an OLED and a method for fabricating the same in accordance with another exemplary embodiment of the present invention.
Figure 8:
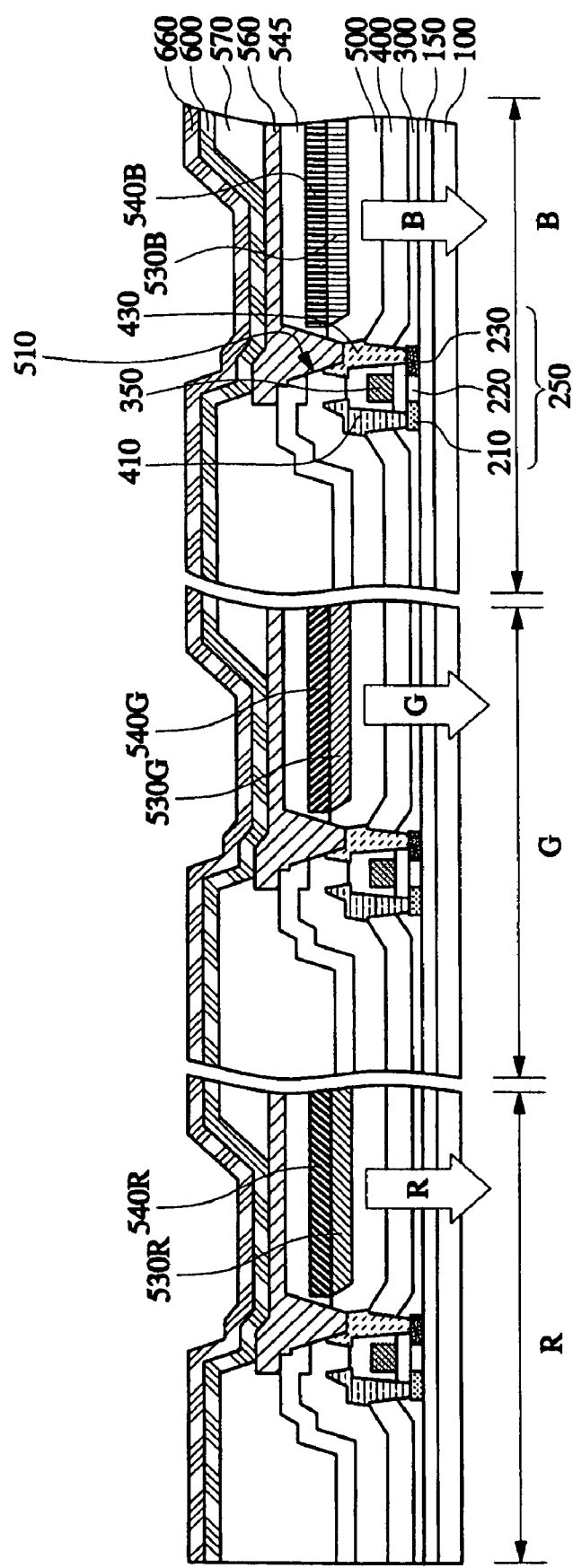

FIG. 7 and FIG. 8 are cross-sectional views illustrating a bottom-emitting active matrix OLED having color modulation layers and a method for fabricating the same in accordance with another exemplary embodiment of the present invention.

Referring to FIG. 7 and FIG. 8, a substrate 100 having a red pixel region R, a green pixel region G and a blue pixel region B is provided. In the present embodiment, the substrate 100 is transparent and can transmit the light. A buffer layer 150 may be formed on the substrate 100. Active layer 250 is formed to have a source region 210, a drain region 230 and a channel region 220, each for the pixel regions R, G and B. A first insulation layer 300 is formed on the active layers 250, and gates 350 are formed on the first insulation layer 300 to correspond to the channel regions 220, respectively.

A second insulation layer 400 covering the gates 350 is formed, and source electrodes 410 and drain electrodes 430 are formed on the second insulation layer 400 to electrically connect to the source regions 210 and the drain regions 230, respectively. The active layer 250, source electrode 410, drain electrode 430 and gate 350 form a TFT. A third insulation layer 500 covering the TFTs is formed. The buffer layer 150, the TFT and the third insulation layer 500 may be the same as explained in the exemplary embodiment of FIG. 3 and FIG. 4. In each of the pixel regions R, G and B, regions where the TFTs are formed may be light shielding regions that shield the light emitted from the emission layer to be formed in a subsequent process. Remaining regions except the light shielding regions may be light transmitting regions that transmit the light emitted from the emission layer to be formed in the subsequent process.

Color modulation layers are formed using LITI on the third insulation layer 500 of the light transmitting regions, each for the pixel regions R, G and B. Alternatively, as is not shown in the figure, color modulation layers may be formed between the third insulation layer 500 and the second insulation layer 400, between the second insulation layer 400 and the first insulation layer 300, between the first insulation layer 300 and the buffer layer 150, and/or between the buffer layer 150 and the substrate 100 in the light transmitting regions. The color modulation layer is at least one of a CF and a CCM.

The color modulation layers may be a red CF 530R, a green CF 530G and a blue CF 530B, as shown in FIG. 7. In this case, an emission layer to be formed in a subsequent process is formed to emit white color light.

In the mean time, the color modulation layers may be a red CCM 540R, a green CCM 540G and a blue CCM 540B, as shown in FIG. 8. In this case, the emission layer to be formed in a subsequent process may be formed of one that emits blue color light or white color light, and the blue CCM 540B may not be formed when the emission layer emits the blue color light. Although FIG. 8 shows stacked structure of CCM and CF, it is also understood that a CCM can be used alone.

Further, the color modulation layer may have a stacked structure of a CF and a CCM by forming a red CF 530R, a green CF 530G and a blue CF 530B before forming the CCMs 540R, 540G and 540B, as shown in FIG. 8. In this case, the color modulation layer having the CF and the CCM is formed at one time by the LITI method. Alternatively, CCMs 540R, 540G and 540B may be formed before CFs 530R, 530G and 530B, respectively. In this case, the emission layer to be formed in a subsequent process may be formed of one that emits blue color light or white color light When the CFs (530R, 530G and 530B of FIG. 7) and/or the CCMs (540R, 540G and 540B of FIG. 8) are formed on the third insulation layer 500, the overcoating layer 545 may be formed on the CFs (530R, 530G and 530B of FIG. 7), or the CCMs (540R, 540G and 540B of FIG. 8).

Via holes 510 are formed to expose each of the drain electrodes 430 within the third insulation layer 500 and the overcoating layer 545. First electrodes 560 are formed on the exposed drain electrodes 430 and the overcoating layer 545 of the light transmitting regions to correspond to the color modulation layers, respectively. The first electrode 560 is electrically connected to the drain electrode 430, namely the TFT through the via hole 510. In the present embodiment, the first electrodes 560 are transparent, and the light emitted from the emission layer to be formed in a subsequent process is transmitted through the first electrodes 560. The first transparent electrodes 560 may be formed as anodes or cathodes.

The pixel-defining layer 570 is formed to have openings which expose some portions of surfaces of the first electrodes 560. An organic functional layer 600 is then formed to have at least an emission layer on exposed first electrodes 560 of pixel regions R, G and B. The organic functional layer 600 may be formed to further include a charge transporting layer and/or a charge injection layer.

The second electrodes 660 are formed on the organic functional layer 600. In the present embodiment, the second electrode 660 is reflective and reflects the emitted light from the emission layer. The second electrode 660 is formed as a cathode when the first electrodes 560 are anodes, and an anode when the first electrodes 560 are cathodes. As a result, the bottom-emitting active matrix OLED having the color modulation layers is fabricated.

Figure 9:
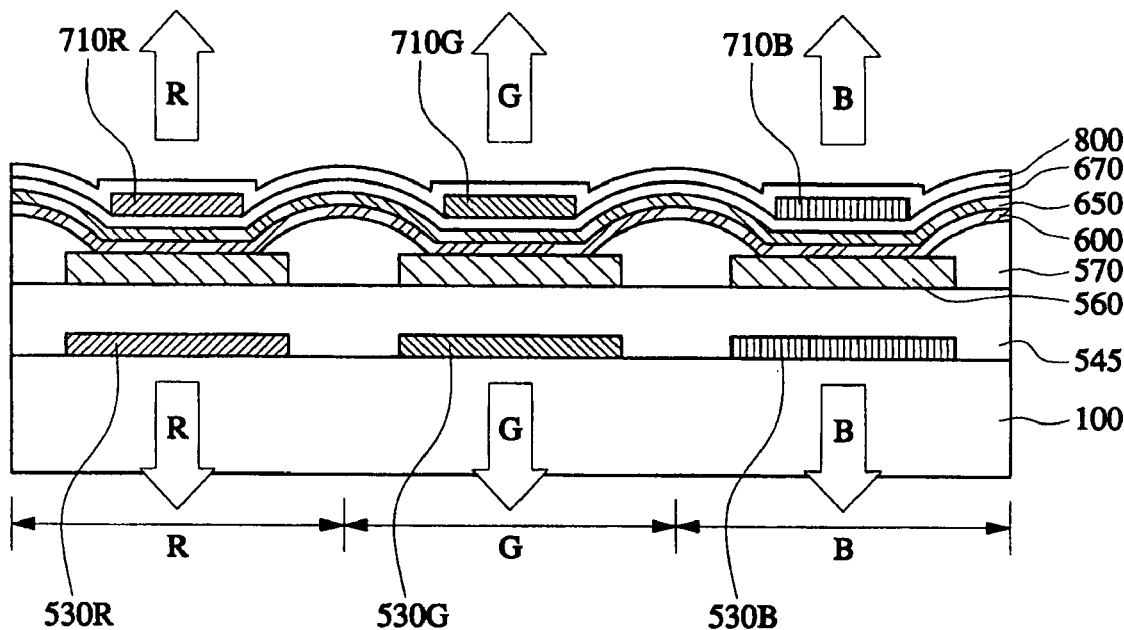
FIG. 9 and FIG. 10 are cross-sectional views illustrating an OLED and a method for fabricating the same in accordance with another exemplary embodiment of the present invention.
Figure 10:
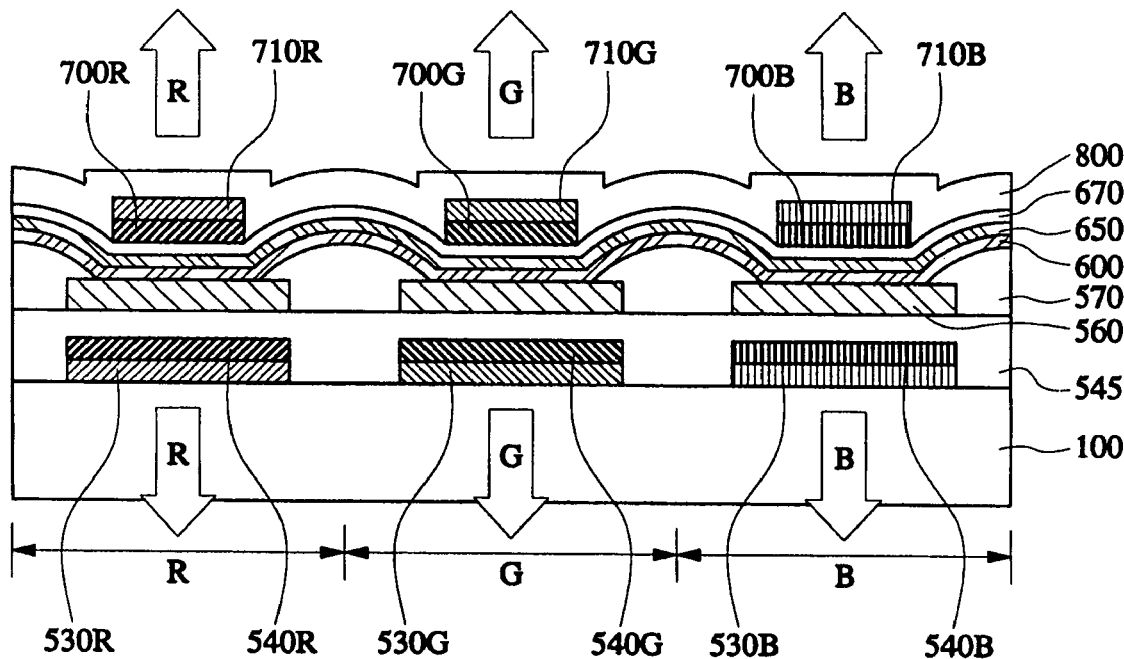

FIG. 9 and FIG. 10 are cross-sectional views illustrating a double-side emitting passive matrix OLED having color modulation layers and a method for fabricating the same in accordance with another exemplary embodiment of the present invention.

Referring to FIG. 9 and FIG. 10, the substrate 100 has a red pixel region R, a green pixel region G and a blue pixel region B. In an exemplary embodiment of the present embodiment, the substrate 100 can transmit light.

First color modulation layers are formed, using LITI, on the substrate 100 to be separated from one another for each of the pixel regions R, G and B. The first color modulation layer is at least one of a CF and a CCM.

The first color modulation layers may be a first red CF 530R, a first green CF 530G and a first blue CF 530B, as shown in FIG. 9. In this case, an emission layer to be formed in a subsequent process is formed to emit white color light.

The first color modulation layers also may be a first red CCM 540R, a first green CCM 540G and a first blue CCM 540B, as shown in FIG. 10. In this case, the emission layer to be formed in a subsequent process may be formed of one that emits blue color light or white color light, and the first blue CCM 540B may not be formed when the emission layer emits the blue color light.

Further, the first color modulation layer may have a stacked structure of a first CF and the first CCM by forming a first red CF 530R, a first green CF 530G and a first blue CF 530B before forming the first CCMs 540R, 540G and 540B as shown in FIG. 10. In this case, the first color modulation layer having the first CF and the first CCM may be formed at one time by the LITI method. Alternatively, CCMs 540R, 540G and 540B may be formed before CFs 530R, 530G and 530B, respectively. In this case, the emission layer to be formed in a subsequent process may be formed of one that emits blue color light or white color light.

The first overcoating layer 545 is formed on the substrate 100 where the first CFs (530R, 530G and 530B of FIG. 9) and/or the first CCMs (540R, 540G and 540B of FIG. 10) are formed. The first overcoating layer 545 is transparent, and prevents the first CFs 530R, 530G and 530B and/or the first CCMs 540R, 540G and 540G from physical damages, etc, and also covers steps that may occur due to the formation of the first CCMs 540R, 540G and 540B, and/or the first CFs 530R, 530G and 530B.

The first electrodes 560 are formed on the first overcoating layer 545 to correspond to the first CFs 530R, 530G and 530B, respectively. In the present embodiment, the first electrodes 560 are transparent electrodes, and the light emitted from the emission layer to be formed in the subsequent process is transmitted through the first electrodes 560. The first electrodes 560 may be formed as anodes or cathodes. The pixel-defining layer 570 is formed to have openings which expose some portions of surfaces of the first electrodes 560. The pixel-defining layer 570 is, for example, formed of an acrylic-based organic layer or similar material. An organic functional layer 600 is formed to have at least an emission layer on the exposed first electrodes 560 of the pixel regions R, G and B. The organic functional layer 600 may be formed to further include a charge transporting layer and/or a charge injection layer.

The second electrodes 650 are formed across the first electrodes 560 on the organic functional layer 600. In the present embodiment, the second electrode 650 is also transparent, and light emitted from the emission layer is transmitted through the first electrodes 560 and the second electrode 650. The second electrode 650 is a cathode when the first electrodes 560 are anodes, and an anode when the first electrodes 560 are cathodes. A passivation layer 670 is formed on the second electrode 650. The passivation layer 670 may be formed of an inorganic layer, an organic layer, or a composite layer thereof. The inorganic layer may be one selected from a group consisting of ITO, IZO, $SiO_2$, $SiN_x$, $Y_2O_3$, $Al_2O_3$ or similar material. The organic layer may be parylene, HDPE or other similar material, and the composite layer may be formed of $Al_2O_3$ and an organic polymer, or similar material.

Second color modulation layers are formed using LITI method on the passivation layer 670 to correspond to the first electrodes 560. The second color modulation layer is at least one of a CF and a CCM.

The second color modulation layers may be a second red CF 710R, a second green CF 710G and a second blue CF 710B as shown in FIG. 9. In this case, the emission layer may be formed of one that emits white color light.

The second color modulation layers may also be a second red CCM 700R, a second green CCM 700G and a second blue CCM 700B, as shown in FIG. 10. In this case, the emission layer may be formed of one that emits blue color light or white color light. When the emission layer emits the blue color light, the second blue CCM 700B may not be formed.

Further, the second color modulation layer may have a stacked structure of a CF and the second CCM by forming a second red CF 710R, a second green CF 710G and a second blue CF 710B on the CCMs 700R, 700G and 700B, respectively as shown in FIG. 10. In this case, the second color modulation layer having the second CF and the second CCM may be formed at one time by the LITI method. Alternatively, the red CCM 700R, green CCM 700G and blue CCM 700B may be formed on the CFs 710R, 710G and 710B, respectively. In this case, the emission layer may be formed of one that emits blue color light or white color light.

A second overcoating layer 800 is formed on the second CFs (710R, 710G and 710B of FIG. 9 and FIG. 10) and/or on the second CCMs (700R, 700G and 700B of FIG. 10) when the second CFs are not formed on the second CCMs. The second overcoating layer 800 is transparent, and acts to prevents the second CFs (710R, 710G and 710B of FIG. 9 and FIG. 10) and/or the second CCMs (700R, 700G and 700B of FIG. 10) from physical damages, etc. As a result, the double-side-emitting passive matrix OLED having the color modulation layers is fabricated.

Figure 11:
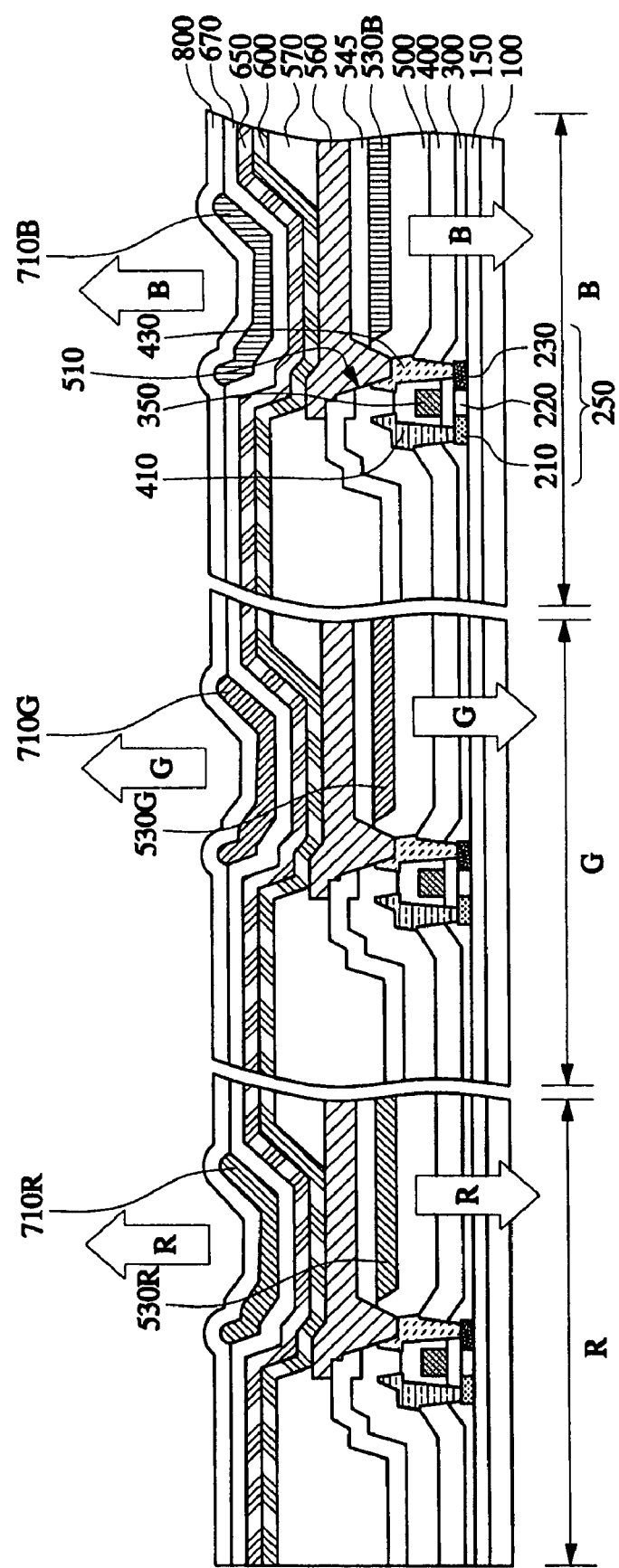
FIG. 11 and FIG. 12 are cross-sectional views illustrating an OLED and a method for fabricating the same in accordance with another exemplary embodiment of the present invention.
Figure 12:
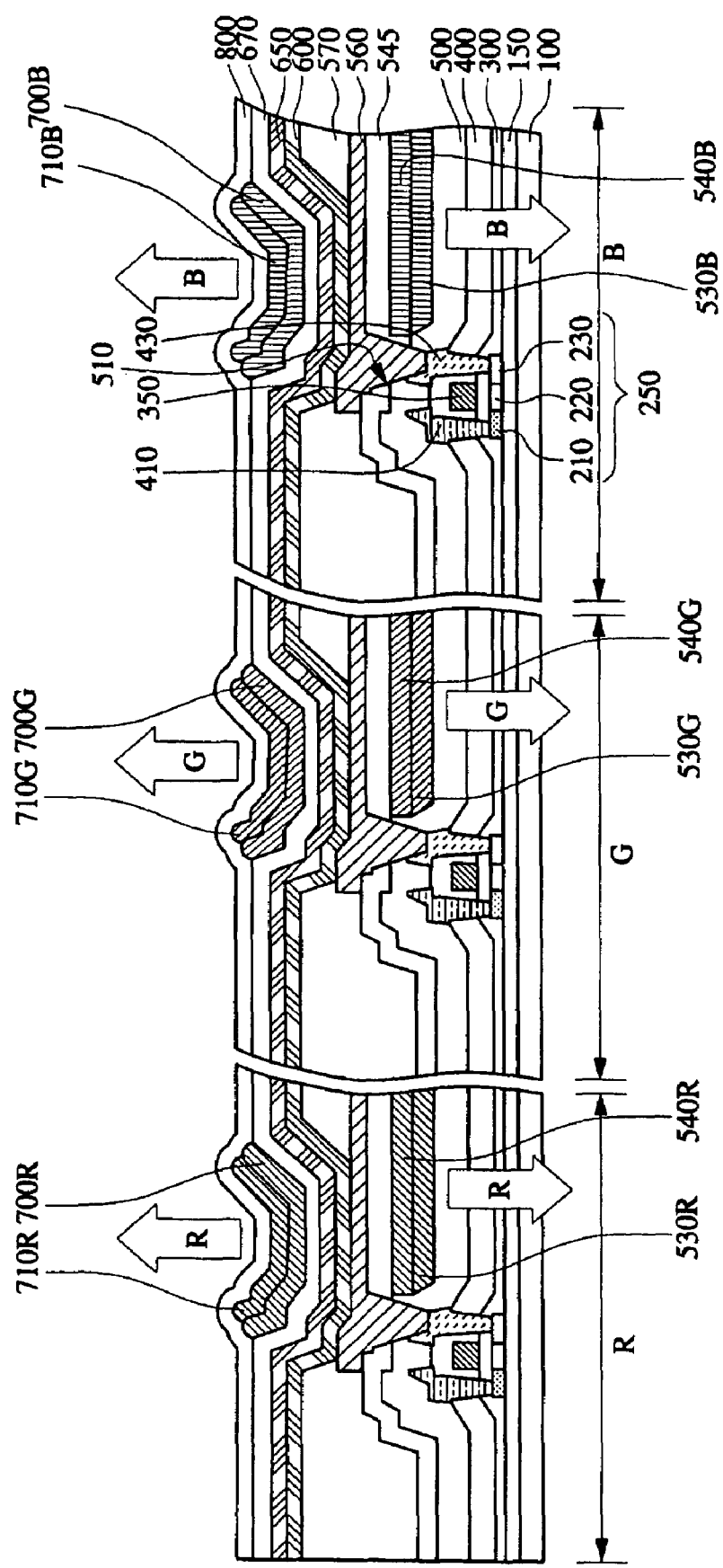

FIG. 11 and FIG. 12 are cross-sectional views illustrating a double-side-emitting active matrix OLED having color modulation layers and a method for fabricating the same in accordance with another exemplary embodiment of the present invention.

Referring to FIG. 11 and FIG. 12, the substrate 100 has a red pixel region R, a green pixel region G and a blue pixel region B. In the present embodiment, the substrate 100 is transparent and can transmit light. A buffer layer 150 may be formed on the substrate 100. Active layers 250 are formed to have source regions 210, drain regions 230 and channel regions 220, for each of the pixel regions R, G and B. A first insulation layer 300 is formed on the active layers 250, and gates 350 are formed on the first insulation layer 300 to correspond to the channel regions 220, respectively.

A second insulation layer 400 covering the gates 350 is formed, and source electrodes 410 and drain electrodes 430 are formed on the second insulation layer 400 to electrically connect to the source regions 210 and the drain regions 230, respectively. The active layer 250, the source electrode 410, the drain electrode 430 and the gate 350 form a TFT. A third insulation layer 500 covering the TFTs is formed. The buffer layer 150, the TFT and the third insulation layer 500 may be the same as that in the exemplary embodiment of FIG. 3 and FIG. 4. In each of the pixel regions R, G and B of the substrate 100, regions where the TFT is formed may be light shielding regions that shield the light emitted from the emission layer to be formed in a subsequent process, and remaining regions except the light shielding regions may be light transmitting regions that transmit the light emitted from the emission layer to be formed in the subsequent process.

First color modulation layers are formed using LITI method on the third insulation layer 500 of the light transmitting regions for each of the pixel regions R, G and B. Alternatively, as is not shown in the figure, the first color modulation layers may be formed between the third insulation layer 500 and the second insulation layer 400, between the second insulation layer 400 and the first insulation layer 300, between the first insulation layer 300 and the buffer layer 150, or between the buffer layer 150 and the substrate 100 in the light transmitting regions. The first color modulation layer is at least one of a CF and a CCM.

The first color modulation layers may be a first red CF 530R, a first green CF 530G and a first blue CF 530B, as shown in FIG. 11. In this case, an emission layer to be formed in a subsequent process is formed to emit white color light.

The first color modulation layers may also be a first red CCM 540R, a first green CCM 540G and a first blue CCM 540B, as shown in FIG. 12. In this case, the emission layer to be formed in a subsequent process may be formed of one that emits blue color light or white color light, and the first blue CCM 540B may not be formed when the emission layer emits the blue color light.

Further, the first color modulation layer may have a stacked structure of a CF and the first CCM by forming a first red CF 530R, a first green CF 530G and a first blue CF 530B before forming the first CCMs 540R, 540G and 540B as shown in FIG. 12. In this case, the first color modulation layer having the first CF and the first CCM may be formed at one time by the LITI method. Alternatively, CCMs 540R, 540G and 540B may be formed before forming CFs 530R, 530G and 530B. In this case, the emission layer to be formed in a subsequent process may be formed of one that emits blue color light or white color light.

When the first CFs (530R, 530G and 530B of FIG. 11) or the first CCMs (540R, 540G and 540B of FIG. 12) are formed on the third insulation layer 500, the first overcoating layer 545 may be formed on the first CFs 530R, 530G and 530B, and/or the first CCMs 540R, 540G and 540B.

Via holes 510 are formed to expose each of the drain electrodes 430 within the third insulation layer 500 and the overcoating layer 545. First electrodes 560 are formed on the exposed drain electrodes 430 and the overcoating layer 545 of the light transmitting regions to correspond to the color modulation layers, respectively. The first electrode 560 is electrically connected to the drain electrode 430 through the via hole 510. In the present embodiment, the first electrodes 560 are transparent, and the light emitted from the emission layer to be formed in the subsequent process is transmitted through the first electrodes 560. The first transparent electrodes 560 may be anodes or cathodes.

The pixel-defining layer 570 is formed to have openings, which expose some portions of surfaces of the first electrodes 560. An organic functional layer 600 is formed to have at least an emission layer on the exposed first electrodes 560 of the pixel regions R, G and B. The organic functional layer 600 may be formed to further include a charge transporting layer and/or a charge injection layer.

The second electrodes 650 are formed on the organic functional layer 600. In the present embodiment, the second electrode 650 is also transparent, and the light emitted from the emission layer is transmitted through the first electrodes 560 as well as the second electrode 650. The second electrode 650 is a cathode when the first electrodes 560 are anodes, and an anode when the first electrodes 560 are cathodes. A passivation layer 670 is formed on the second electrode 650. The passivation layer 670 may be formed of one of an inorganic layer, an organic layer, and a composite layer thereof. The inorganic layer may be selected from a group consisting of ITO, IZO, $SiO_2$, SiNx, $Y_2O_3$, $Al_2O_3$ or other similar material. The organic layer may be parylene, HDPE or other similar material. And the composite layer may be formed of $Al_2O_3$ and an organic polymer or other similar material.

Second color modulation layers are formed using the LITI method on the passivation layer 670 to correspond to the first electrodes 560. The second color modulation layer is at least one of a CF and a CCM.

The second color modulation layers may be a second red CF 710R, a second green CF 710G and a second blue CF 710B as shown in FIG. 11. In this case, the emission layer may be formed of one that emits white color light.

The second color modulation layers may also be a second red CCM 700R, a second green CCM 700G and a second blue CCM 700B, as shown in FIG. 12. In this case the emission layer may be formed of one that emits blue color light or white color light, the second blue CCM 700B may not be formed when the emission layer emit blue color light.

The second color modulation layer may have a stacked structure of the second CF and the second CCM by forming a second red CF 710R, a second green CF 710G and a second blue CF 710B on the CCMs 700R, 700G and 700B, respectively as shown in FIG. 12. In this case, the second color modulation layer having the second CF and the second CCM is formed at one time by the LITI method. Alternatively, CCMs 700R, 700G and 700B may be formed on CFs 710R, 710G and 710B, respectively. In this case the emission layer may be formed of one that emits blue color light or white color light The overcoating layer 800 is formed on the second CFs (710R, 710G and 710B of FIG. 11 and FIG. 12) and/or on the second CCMs (700R, 700G and 700B of FIG. 12) when the second CFs are not formed on the second CCMs. The overcoating layer 800 is transparent, and prevents the second CFs 710R, 710G and 710B and/or the second CCMs 700R, 700G and 700B from physical damages, etc. As a result, the double-side-emitting active matrix OLED having the color modulation layers is fabricated.

Hereinafter, an experimental example is described for better understanding of the present invention. However, the present invention is not limited to this example.

The following experimental and comparative examples are the examples for examining the quality of the CF pattern and optical characteristics of the OLED having the CF in accordance with the present invention.

EXPERIMENTAL EXAMPLE

Material for the CF (manufactured by 3M Co.) was deposited on a donor film (manufactured by 3M Co.) to form a transfer layer, while preparing a substrate. The donor film was arranged to make the transfer layer face the substrate and was irradiated by an Nd-YAG laser, so that the transfer layer was transferred onto the substrate. In the transfer process, the laser power was 10 W, and the scanning speed of the laser was 7 m/sec. This process was repeated for each of red, green and blue colors, so that patterns for the red, green and blue CFs were formed on the substrate. Anode patterns were then formed on the CF patterns, respectively, and an emission layer emitting white color light was formed on the anodes. Cathodes were then formed on the emission layer, so that a full color OLED was fabricated.

COMPARATIVE EXAMPLE

A substrate was prepared, and a photoresist (Red6011L for the red color; Green6011L for the green color; Blue6001L for the blue color, all manufactured by Fuji Hunt Co.) for the CF was deposited on the substrate and then exposed and developed to form a pattern for the CF. This process was repeated for each of the red, green and blue colors, so that patterns for the red, green and blue CFs were formed. Anode patterns were then formed on the CF patterns, respectively, and an emission layer emitting white color light was formed on the anodes. Cathodes were then formed on the emission layer, so that a full color OLED was fabricated.

TABLE 1

| | Experimental example | | |
|---|---|---|---|
| Pattern quality | Red color | Green color | Blue color |
| Pattern width (μm) | 94.89 ± 1.08 | 99.98 ± 1.46 | 106.30 ± 0.70 |
| Pattern edge roughness (μm) | 1.23 ± 0.36 | 1.51 ± 0.46 | 0.62 ± 0.26 |
| Pattern surface roughness (μm) | 0.039 ± 0.009 | 0.064 ± 0.018 | 0.036 ± 0.012 |

When the pattern width for the CFs in accordance with the comparative example is the same as that of the experimental example, the pattern edge roughness of the comparative example is about 2±0.1 μm. As can be seen in Table 1, the quality of the pattern for the CFs shows an improved result for the pattern edge roughness.

TABLE 2

| Optical characteristic | | Experimental example | | | | Comparative example | | | |
|---|---|---|---|---|---|---|---|---|---|
| | | Red | Green | Blue | White | Red | Green | Blue | White |
| Chromaticity coordinate | x | 0.597 | 0.314 | 0.140 | 0.319 | 0.615 | 0.304 | 0.139 | 0.306 |
| | y | 0.35 | 0.534 | 0.158 | 0.355 | 0.339 | 0.542 | 0.155 | 0.343 |
| | Y | 27.16 | 63.53 | 18.65 | 36.62 | 21.53 | 59.94 | 17.98 | 33.15 |
| Transmittance (% at 460 nm) | | 87.4 | 82.9 | 73.7 | — | 87.15 | 80.06 | 75.62 | — |
| Color reproducibility (%) | | | 43.75 | | | | 48.63 | | |

Referring to the Table 2, the x, y and the transmittance of the each color of the experimental example are similar to that of the comparative example. But the white Y and the color reproducibility of the experimental example have been improved about 10.5% and about 4.9%, respectively, compared to that of the comparative example.

As mentioned above, the emission layer having a single color is formed on the pixel regions R, G and B, and the color modulation layers are formed by the LITI method on the pixel regions R, G and B, respectively, so that white balance can be maintained even after it is driven for a long time. The time for the fabrication process can be reduced and high resolution can be implemented at the same time. In addition, it is expected that the optical characteristic and the pattern quality of the color modulation layers may be improved.

While the present invention has been described with reference to a particular embodiment, it is understood that the disclosure has been made for purpose of illustrating the invention by way of examples and is not limited to limit the scope of the invention. And one skilled in the art can make amend and change the present invention without departing from the scope and spirit of the invention.

What is claimed is:

1. An organic light-emitting device, comprising:
a substrate; and
a first pixel region, a second pixel region, and a third pixel region, wherein each pixel region comprises:
a first electrode positioned on the substrate;
a second electrode positioned on the first electrode, wherein at least one of the first electrode and the second electrode is a transparent electrode;
an organic functional layer interposed between the first and the second electrodes, where the organic functional layer includes an emission layer emitting white color light; and
a color modulation layer positioned on a surface opposite to a surface adjacent to the emission layer of the transparent electrode, wherein the color modulation layer comprises a color conversion medium and is formed by a laser-induced thermal imaging method,
wherein the color modulation layer in the first pixel region is separated from the color modulation layer in the second pixel region and the color modulation layer in the third pixel region.

2. The organic light-emitting device of claim 1, wherein the color modulation layer has a stacked structure of the color conversion medium and a color filter.

3. The organic light-emitting device of claim 2, wherein the color conversion medium is positioned on a surface opposite to a surface adjacent to the emission layer of the transparent electrode, and the color filter is positioned on a surface opposite to a surface adjacent to the transparent electrode of the color conversion medium.

4. The organic light-emitting device of claim 2, wherein the color modulation layer having the color conversion medium and the color filter is formed at one time by the laser-induced thermal imaging method.

5. The organic light-emitting device of claim 1, wherein the emission layer comprises at least one of a polymer material and a non-polymer material.

6. The organic light-emitting device of claim 1, wherein the emission layer has a stacked structure of at least two sub-emission layers.

7. The organic light-emitting device of claim 1, wherein the emission layer is formed by at least one of a vacuum deposition method and a spin-coating method.

8. The organic light-emitting device of claim 1, wherein the organic functional layer further includes at least one of a charge injection layer and a charge transporting layer.

9. The organic light-emitting device of claim 1, further comprising a thin film transistor electrically coupled to the first electrode.

10. The organic light-emitting device of claim 1, wherein the second electrode is the transparent electrode when the first electrode is a reflective electrode, and the color modification layer is positioned on the second electrode.

11. The organic light-emitting device of claim 10, further comprising a thin film transistor electrically coupled to the first electrode.

12. The organic light-emitting device of claim 10, further comprising a passivation layer interposed between the second electrode and the color modulation layer.

13. The organic light-emitting device of claim 12, wherein the passivation layer is one of an inorganic layer, an organic layer, and a composite layer of an inorganic layer and an organic layer.

14. The organic light-emitting device of claim 10, further comprising an overcoating layer on the color modulation layer.

15. The organic light-emitting device of claim 1, wherein the first electrode is the transparent electrode when the second electrode is a reflective electrode, and the color modulation layer is positioned between the substrate and the first electrode.

16. The organic light-emitting device of claim 15, further comprising an overcoating layer interposed between the first electrode and the color modulation layer.

17. The organic light-emitting device of claim 15, further comprising a thin film transistor coupled to the first electrode.

18. The organic light-emitting device of claim 15, further comprising:
an active layer having a source region, a drain region and a channel region;
a first insulation layer positioned on the active layer;
a gate electrode positioned on the first insulation layer to correspond to the channel region;
a second insulation layer positioned on the gate electrode;
a source electrode and a drain electrode positioned on the second insulation layer and connected to the source region and the drain region, respectively; and
a third insulation layer positioned on the source electrode and the drain electrode and having a via hole exposing one of the source electrode and the drain electrode;
wherein the first electrode is positioned on the third insulation layer and connected to the exposed one of the source electrode and the drain electrode through the via hole, and the color modulation layer is positioned between the first electrode and the substrate.

19. The organic light-emitting device of claim 18, wherein the color modulation layer is positioned in at least one place of a place between the first electrode and the third insulation layer, a place between the third insulation layer and the second insulation layer, a place between the second insulation layer and the first insulation layer, and a place between the first insulation layer and the substrate.

20. The organic light-emitting device of claim 19, further comprising an overcoating layer interposed between the first electrode and the color modulation layer, when the color modulation layer is positioned between the first electrode and the third insulation layer.

21. The organic light-emitting device of claim 1, wherein the first electrode and the second electrode are transparent, the color modulation layer includes a first color modulation layer positioned between the substrate and the first electrode, and a second color modulation layer positioned on the second electrode.

22. The organic light-emitting device of claim 21, further comprising a first overcoating layer interposed between the first electrode and the first color modulation layer.

23. The organic light-emitting device of claim 21, further comprising a passivation layer between the second color modulation layer and the second electrode.

24. The organic light-emitting device of claim 23, wherein the passivation layer is one of an inorganic layer, an organic layer, and a composite layer of an inorganic layer and an organic layer.

25. The organic light-emitting device of claim 21, further comprising a second overcoating layer on the second color modulation layer.

26. The organic light-emitting device of claim 21, further comprising a thin film transistor coupled to the first electrode.

27. The organic light-emitting device of claim 21, further comprising:
- an active layer having a source region, a drain region and a channel region;
- a first insulation layer positioned on the active layer;
- a gate electrode positioned on the first insulation layer to correspond to the channel region;
- a second insulation layer positioned on the gate electrode;
- a source electrode and a drain electrode positioned on the second insulation layer, and coupled to the source region and the drain region, respectively; and
- a third insulation layer positioned on the source electrode and the drain electrode and having a via hole exposing one of the source electrode and the drain electrode;

wherein the first electrode is positioned on the third insulation layer and coupled to the exposed one of the source electrode and the drain electrode through the via hole, and the first color modulation layer is positioned between the first electrode and the substrate.

28. The organic light-emitting device of claim 27, wherein the first color modulation layer is positioned in at least one place of a place between the first electrode and the third insulation layer, a place between the third insulation layer and the second insulation layer, a place between the second insulation layer and the first insulation layer, and a place between the first insulation layer and the substrate.

29. The organic light-emitting device of claim 28, further comprising a first overcoating layer interposed between the first electrode and the first color modulation layer, when the first color modulation layer is positioned between the first electrode and the third insulation layer.

30. The organic light-emitting device of claim 1, wherein the first electrode is an anode and the second electrode is a cathode.

31. The organic light-emitting device of claim 1, wherein the first electrode is a cathode and the second electrode is an anode.

* * * * *